United States Patent [19]

Fagan et al.

[11] 3,971,058

[45] July 20, 1976

[54] DUAL EMITTER PROGRAMMABLE MEMORY ELEMENT AND MATRIX

[75] Inventors: Lloyd D. Fagan, Santa Clara; Gareth A. Tripp, Mountain View, both of Calif.

[73] Assignee: Intersil Incorporated, Cupertino, Calif.

[22] Filed: Jan. 7, 1974

[21] Appl. No.: 431,394

[52] U.S. Cl. .................................. 357/36; 357/45; 340/173 SP
[51] Int. Cl.² .................. G11C 11/44; H01L 29/72; H01L 27/10
[58] Field of Search ............ 357/36, 45; 340/173 SP

[56] References Cited
UNITED STATES PATENTS

| | | | |
|---|---|---|---|
| 3,735,358 | 5/1973 | Ho | 357/36 |
| 3,784,976 | 1/1974 | Ho | 357/36 |
| 3,801,967 | 4/1974 | Berger et al. | 357/36 |

*Primary Examiner*—Edward J. Wojciechowicz
*Attorney, Agent, or Firm*—Gregg, Hendricson, Caplan & Becker

[57] ABSTRACT

A plurality of dual emitter integrated circuit transistor elements in a single substrate having emitters interconnected to form a matrix is programmed by passing current between emitters of selected elements to short one base-emitter junction or to short one emitter to base and collector. A programmed ROM has a programmed bit electrically represented by a transistor and an unprogrammed location electrically represented by back-to-back transistors. Alternative programming of a bit or address may provide a diode connection for a programmed matrix bit and furthermore may provide an extremely short or low storage time for a programmed matrix bit diode.

8 Claims, 4 Drawing Figures

DUAL EMITTER PROGRAMMABLE MEMORY ELEMENT AND MATRIX

BACKGROUND OF INVENTION

It is known to form field programmable integrated circuit memory matrixes with a variety of different electrically alterable elements. Thus for example, fusible links and transistors are employed for this purpose. The fusible link matrix normally incorporates a link of nichrome or the like which melts and separates upon the application of sufficient electrical power thereto to form an open circuit as the programmed bit in the matrix. A transistor matrix is programmed by application of sufficient electrical power to electrically short one junction of the transistor so as to leave only a single forward conducting diode as a programmed bit in the matrix. These type of matrixes have generally replaced the diode matrixes and are herein termed ROMs.

The advantages and wide applicability of field programmable memories has been amply demonstrated by the commercial success thereof. In this rapidly moving field there have been made numerous significant advancements including the programming method and system of U.S. Pat. No. 3,733,690. As a continuation of this rapid advancement in the field, the present invention provides an improved programmable ROM element and matrix affording greater flexibility to the designer and simplification of programming requirements.

SUMMARY OF INVENTION

The present invention comprises a field programmable integrated circuit matrix having a plurality of dual emitter transistor elements formed in a single substrate with first emitters of the matrix connected in rows and second emitters of the matrix in columns by electrical conductors. Individual elements of the present invention are irreversibly programmed by energizing a selected row and column to pass a current from one emitter to the other of a selected element for electrically shorting one base emitter junction and thus providing a base connection to a single emitter transistor as a programmed location or address. Alternatively, the element may be conventionally programmed by providing a collector connection. Furthermore, it is possible to apply sufficient programming current to electrically short an emitter to both the base and collector whereby a single diode with very low storage time is provided as a programmed address.

DESCRIPTION OF FIGURES

The present invention as illustrated as to a preferred embodiment thereof in the accompanying drawings wherein.

DESCRIPTION OF PREFERRED EMBODIMENT

Figure 1:
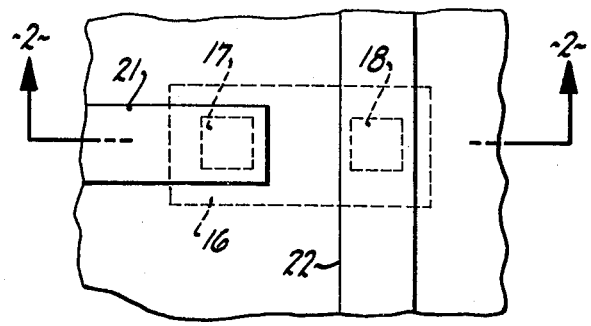
FIG. 1 is a schematic plan illustration of a dual emitter programmable element in accordance with the present invention.
Figure 2:
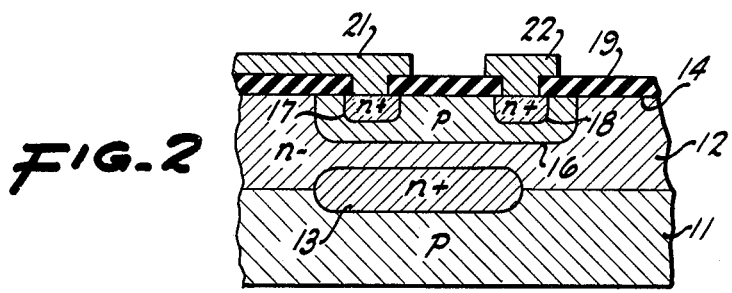
FIG. 2 is a sectional view taken in the plane 2—2 of FIG. 1.

A memory array or matrix in accordance with the present invention is comprised of a plurality of dual emitter transistor elements formed in a single substrate and one of such elements is illustrated in FIGS. 1 and 2. Upon a substrate 11 which may have a p— conductivity there is preferably provided an epitaxial layer 12 of n— conductivity. An n+ conductivity buried collector region 13 is provided by conventional techniques below the upper surface 14 of the epitaxial layer and generally disposed in the substrate. A base region 16 of p conductivity extends into the epitaxial layer 12 at the upper surface 14 above the region 13, and within the base region there are provided two n+ emitter regions 17 and 18 extending into the upper surface thereof as illustrated. The base region 16 may be made quite small inasmuch as the present invention does not require separate electrical contact thereto.

In accordance with the conventional integrated circuit technology, the upper surface 14 is covered by a protective insulating layer and in the circumstance of a silicon substrate the layer is formed as a silicon oxide layer 19. Openings are made by conventional techniques through the oxide layer 19 to the emitter regions 17 and 18 and separate electrical conductors 21 and 22 extend therethrough into ohmic contact with these regions 17 and 18.

The structure of the dual emitter element illustrated in FIGS. 1 and 2 briefly described above may be readily formed by conventional integrated circuit techniques. The element may be considered as two transistors with the region 16 comprising a common base for such transistors, the common collector being provided by the region 13 and the portions of layer 12 between region 13 and the base 16. The regions 17 and 18 may be considered as emitters of the two transistors with electrical contacts extending from these emitters. It will be appreciated that a plurality of these elements are formed as by diffusion and other conventional processing steps in a single substrate to form a matrix as further discussed below.

Figure 3:
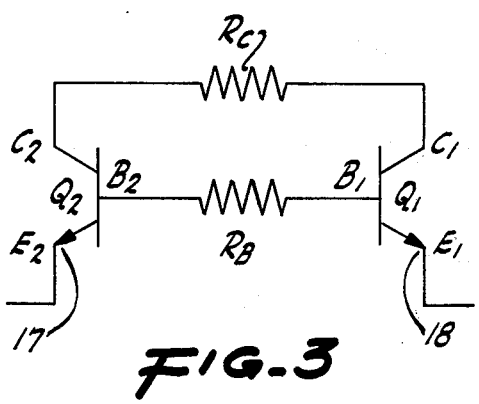
FIG. 3 is a schematic illustration of the equivalent electrical circuit programmable element of the FIGS. 1 and 2.

There is illustrated in FIG. 3 an equivalent electrical circuit of the dual emitter transistor matrix element of FIG. 2. In FIG. 3 the element is illustrated as two transistors $Q_1$ and $Q_2$ having the bases thereof connected together by a resistor $R_B$ which represents the resistance of the base 16 between the two emitters 17 and 18. The collectors of $Q_1$ and $Q_2$ are shown to be connected together by a resistor $R_C$ which represents the combined epitaxial layer and buried collector resistance from the base 16 downwardly through the region 13 and back up to the base. In FIG. 3 the elements of the transistor $Q_1$ are labeled for convenience $E_1$ for the emitter, $C_1$ for the collector and $B_1$ for the base and, similarly, the elements of transistor $Q_2$ are labeled $E_2$ for the emitter, $C_2$ for the collector and $B_2$ for the base. These identifications are employed in the following description of the programming of the element of the present invention in a memory matrix.

It is first noted that the element of the present invention, as illustrated in FIGS. 1 and 2 and electrically represented in FIG. 3, may be programmed in the same manner as a single emitter structure. Thus, by providing a collector contact, current may be forced from either emitter $E_1$ or $E_2$ to the collector by external circuitry so that either base-emitter junction may be shorted to leave only a forwardly conducting transistor junction at the matrix address as an indication of a programmed bit.

The present invention may, however, be more advantageously programmed by forcing a current from one emitter to the other. The emitter which is reverse biased will short to the base leaving the other emitter intact. Considering this programming somewhat further and referring to FIG. 3, if a current is forced from $E_2$ to $E_1$, a small current will flow from $B_2$ to $B_1$ through $R_B$ and through the $Q_1$ base-emitter junction to turn on transistor $Q_1$. Most of the current flowing into $E_2$ will flow through the base-collector junction of $Q_2$ which is forward biased by the voltage drop developed across $R_B$ and then through $R_C$ and from collector to emitter of $Q_1$. The ratio of collector current to base current is determined by $R_C$, $R_B$ and the amplification, or beta, of $Q_1$. This ratio can be made quite high with the result that $Q_2$ is programmed very much as if the current flow was entirely from emitter to collector.

It is noted that a number of advantages are attained by the present invention programmed as described immediately above. Comparing the present invention, for example, to a conventional single transistor matrix, it is noted that in the latter matrix the programming current must flow through either a fairly long narrow buried collector or a collector contact or both, which results in a high series resistance. In the dual emitter structure of the present invention, the programming current flows through a very short buried collector and through a second transistor. The series resistance may thus be made quite small even with a fairly high resistivity buried layer. This allows the use of a lower programming voltage.

A further, and possibly even more important, advantage of the present invention is that following programming of a bit or address, a transistor remains rather than a diode as in a single transistor matrix. In an array in accordance with the present invention, programming provides a means of selectively making contact to bases of transistors. Considering this point further it is noted that a programmed element of the present invention wherein a current is passed from $E_2$ to $E_1$ causes shorting of the $E_2$ - $B_2$ junction so that in effect the $E_2$ connection is made to $B_1$ without actually providing a physical contact to the base. It will be appreciated that this is advantageous in limiting the size of the base. It is further noted that for some type of ROMs a transistor is a much more desirable array element than a diode. The transistor remaining after programming of an element of the present invention can also be employed simply as a diode and thus it will be seen that the dual emitter structure of this invention is much more versatile than a conventional single transistor array.

It is also possible in programming of an element of the present invention to force a programming current into $Q_2$, for example, until the emitter $E_2$ shorts to both the base and collector of $Q_2$. While such shorting in a single transistor array is highly disadvantageous, it may be intentionally carried out in accordance with the present invention to short the emitter to base and collector of $Q_2$, for example. The foregoing produces a transistor $Q_1$ with its base and collector shunted by $R_C + R_B$. This then produces a diode, i.e., from the collector-base to emitter of $Q_1$ with a very low storage time as opposed to the relatively long storage time of a base-emitter diode or a base-collector diode. For certain applications this very short storage time is highly advantageous. It is also noted that the intentional shorting of emitter to both base and collector obviates certain prior art problems of limiting shorting to the base-emitter junction.

Figure 4:
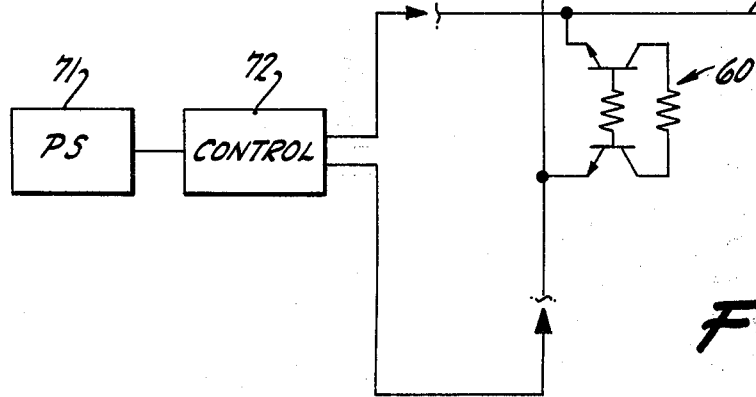
FIG. 4 is a schematic illustration of a portion of a matrix comprised of interconnected elements of the present invention.

The present invention may be employed in a variety of ways for a memory array, as generally noted above, and in FIG. 4 there is illustrated a portion of a matrix having rows 41, 42, etc. and columns 51, 52, etc. with dual emitter transistor elements 60 disposed at each "crossover" of row and column with one emitter connected to a row and the other to a column at the crossover. Programming of individual elements 60 of the matrix of FIG. 4 may be readily accomplished by passing a current between the emitters of any desired element. To this end there is schematically illustrated in FIG. 4 a power supply 71 and control 72 connected, for example, to row 42, column 51. This then provides for passing a current from one emitter to the other of the element 60 at the crossover of row 42 and column 51 so as to program the element at that location or address. As noted above, such programming may be accomplished by shorting one of the base-emitter junctions of the element 60. This then provides a transistor connected between the row 42 and column 51 as a programmed location or address in the matrix. Alternatively, as noted above, it is also possible to program the element by applying sufficient programming current through the control 72 to short one of the emitters of the element 60 to both the base and collector of the element. This then produces a diode of very low storage time at the programmed address.

It will be appreciated that, although the present invention has been described with respect to particular preferred embodiments thereof, numerous variations and modifications may be made within the spirit of the present invention. It is not intended to limit the present invention to the terms of description nor details of illustration.

What is claimed is:

1. An improved integrated circuit field programmable read only memory matrix comprising
    a plurality of dual emitter transistor elements disposed in a single substrate with each transistor having, a high conductivity buried collector region,
    a base region having no electrical contact thereto disposed above said buried collector region and having a PN junction therebetween,
    and a pair of separate emitter regions extending into said base region from an upper surface thereof,
    first electrical conductors connecting pluralities of first emitters of said transistors in separate rows; and
    second electrical conductors connecting pluralities of second emitters of said transistors in separate columns to form a matrix having a programmable address at each crossover of row and column
    whereby application of electrical power between a selected row and column to electrically short a base-emitter junction of an element connected therebetween programs an address of the matrix.

2. The matrix of claim 1 further defined by each of said elements having a buried collector region and a base region disposed in an epitaxial layer over said collector region.

3. The matrix of claim 1 further defined by an insulating layer covering said elements and having openings therethrough to emitters of said elements, and said first and second conductors comprising metal conductors upon said insulating layer extending into ohmic contact with emitters through said openings in said layer.

4. An electrically programmable memory array comprising
a plurality of transistors with each transistor having two separate emitter regions extending into the upper surface of a single base region having no electrical connection thereto and a high conductivity collector region below said base region with a PN junction therebetween,
first electrical conductors connecting together the first emitters of said transistors in separate rows, and
second electrical conductors connecting together second emitters of said transistors in separate columns,
whereby said transistors are individually electrically programmable by the application of programming signals to a selected row and column to electrically short at least a base-emitter junction of the transistor connected to said row and column.

5. A programmed memory matrix comprising
a plurality of dual emitter transistors with each transistor having first and second emitter regions extending into the upper surface of a base region having no electrical connection thereto and a high conductivity collector region beneath said base region with a PN junction therebetween,
a plurality of first conductors electrically connecting first emitters of said transistors in a plurality of separate rows,
a plurality of second conductors electrically connecting second emitters of said transistors in a plurality of separate columns whereby said transistors each have an emitter connected in a row and an emitter connected in a column as a matrix crossover to electrically provide a pair of collector-connected transistors at each row and column crossover as a matrix address, and selected transistors having one electrically shorted emitter-base junction to electrically provide a diode and transistor connected in a series between row and column as a programmed matrix address.

6. The programmed memory matrix of claim 5 further defined by selected transistors having one emitter thereof electrically shorted to the transistor base and the transmitter base shorted to the collector thereof to electrically provide a diode connected between row and column as a programmed matrix address.

7. A method of electrically programming a semiconductor memory matrix having a dual emitter transistor disposed at each row and column crossover with each transistor having a high conductivity collector region, a base region having no electrical contact thereto disposed above said collector region, and having a PN junction therebetween, and a pair of emitter regions extending into said base region from an upper surface thereof, and each transistor having a first emitter connected to one row and a second emitter connected to one column to provide a memory address and comprising the steps of electrically connecting a selected row and column of the matrix across a programming signal source to pass an electrical current between the emitters of the transistor at the crossover thereof, and applying sufficient power to said transistor from said programming signal source to electrically short a base-emitter junction of said transistor and form a programmed address as a crossover connection electrically comprising a transistor and diode connected in series between row and column.

8. The method of programming as set forth in claim 7 further defined by applying additional electrical power from said programming signal source to electrically short said emitter to base and collector to form the programmed address as a diode connected between row and column.

* * * * *